United States Patent
Inaba et al.

(10) Patent No.: US 9,024,443 B2
(45) Date of Patent: May 5, 2015

(54) SEMICONDUCTOR DEVICE AND MANUFACTURING METHOD THEREOF

(71) Applicant: Kabushiki Kaisha Toshiba, Tokyo (JP)

(72) Inventors: Merii Inaba, Yokkaichi (JP); Takeshi Hizawa, Mie-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 59 days.

(21) Appl. No.: 13/836,215

(22) Filed: Mar. 15, 2013

(65) Prior Publication Data

US 2014/0061929 A1 Mar. 6, 2014

(30) Foreign Application Priority Data

Sep. 5, 2012 (JP) .................................. 2012-195167

(51) Int. Cl.
*H01L 23/12* (2006.01)
*H01L 23/52* (2006.01)
*H01L 29/40* (2006.01)
*H01L 21/768* (2006.01)
*H01L 23/522* (2006.01)
*H01L 23/532* (2006.01)
*H01L 27/115* (2006.01)

(52) U.S. Cl.
CPC .............. *H01L 23/52* (2013.01); *H01L 21/768* (2013.01); *H01L 23/5226* (2013.01); *H01L 23/5329* (2013.01); *H01L 23/53295* (2013.01); *H01L 21/76804* (2013.01); *H01L 27/11519* (2013.01); *H01L 27/11565* (2013.01); *H01L 2924/0002* (2013.01)

(58) Field of Classification Search
USPC ........................... 257/758, 773, 774, 775, 635
See application file for complete search history.

(56) References Cited

U.S. PATENT DOCUMENTS

| | | | |
|---|---|---|---|
| 5,091,768 A * | 2/1992 | Yamazaki | 257/758 |
| 5,841,196 A * | 11/1998 | Gupta et al. | 257/774 |
| 6,300,683 B1 * | 10/2001 | Nagasaka et al. | 257/774 |
| 6,645,853 B1 | 11/2003 | Ngo et al. | |
| 7,071,562 B2 | 7/2006 | Ngo et al. | |
| 7,507,666 B2 | 3/2009 | Nakao et al. | |

(Continued)

FOREIGN PATENT DOCUMENTS

| | | | |
|---|---|---|---|
| JP | 2000-332008 A | 11/2000 | |
| JP | 2006-114896 A | 4/2006 | |

(Continued)

OTHER PUBLICATIONS

Office Action issued on Feb. 27, 2015 in Japanese Patent Application No. 2012-195167.

*Primary Examiner* — S. V. Clark
(74) *Attorney, Agent, or Firm* — Oblon, McClelland, Maier & Neustadt, L.L.P.

(57) ABSTRACT

A semiconductor device according to the present embodiment includes a semiconductor substrate. A lower-layer wiring is provided above a surface of the semiconductor substrate. An interlayer dielectric film is provided on the lower-layer wiring and includes a four-layer stacked structure. A contact plug contains aluminum. The contact plug is filled in a contact hole formed in the interlayer dielectric film in such a manner that the contact plug reaches the lower-layer wiring. Two upper layers and two lower layers in the stacked structure respectively have tapers on an inner surface of the contact hole. The taper of two upper layers and the taper of two lower layers have different angles from each other.

8 Claims, 5 Drawing Sheets

(56) References Cited

U.S. PATENT DOCUMENTS

| | | |
|---|---|---|
| 7,713,869 B2 | 5/2010 | Kitada et al. |
| 7,846,833 B2 | 12/2010 | Kitada et al. |
| 8,339,841 B2 * | 12/2012 | Iwayama .................. 365/158 |
| 2004/0063310 A1 | 4/2004 | Ngo et al. |
| 2007/0045851 A1 | 3/2007 | Kitada et al. |
| 2007/0049024 A1 | 3/2007 | Nakao et al. |
| 2008/0083990 A1 | 4/2008 | Hatazaki et al. |
| 2010/0178762 A1 | 7/2010 | Kitada et al. |

FOREIGN PATENT DOCUMENTS

| | | |
|---|---|---|
| JP | 2007-027291 A | 2/2007 |
| JP | 2012-129465 A | 7/2012 |
| WO | 2007-032563 | 3/2007 |

* cited by examiner

SEMICONDUCTOR DEVICE AND MANUFACTURING METHOD THEREOF

CROSS REFERENCE TO RELATED APPLICATIONS

This application is based upon and claims the benefit of priority from the prior Japanese Patent Application No. 2012-195167, filed on Sep. 5, 2012, the entire contents of which are incorporated herein by reference.

FIELD

The embodiments of the present invention relate to a semiconductor device and manufacturing method thereof.

BACKGROUND

In recent years, inter-wiring distances in a semiconductor device are becoming increasingly shorter as elements of the semiconductor device are downscaled. When the inter-wiring distance becomes shorter, the inter-wiring capacity becomes larger. This tendency causes signal delay or an increase in power consumption. To reduce such inter-wiring capacity, it is considered to adopt a low-dielectric-constant film (Low-k film) as a material of an interlayer dielectric film or to increase the thickness of the interlayer dielectric film.

To this end, it is effective to further reduce the dielectric constant of the Low-k film by making the Low-k film porous. However, a porous film is possibly excessively etched in an etching process because an etching rate of the porous film is high. That is, the porous film is difficult to control in the etching process.

Meanwhile, if the thickness of the interlayer dielectric film is increased, the aspect ratio of contact holes is also increased, and the embeddability of a metallic material such as aluminum is deteriorated. When the embeddability is low, it generates voids in contact plugs, which increases contact faults between wirings. A material such as tungsten, which has good embeddability, can be used as the metallic material. However, if tungsten, which is higher than aluminum in cost, is used as the metallic material, it disadvantageously increases the manufacturing cost of semiconductor devices.

DETAILED DESCRIPTION

A semiconductor device according to the present embodiment includes a semiconductor substrate. A lower-layer wiring is provided above a surface of the semiconductor substrate. An interlayer dielectric film is provided on the lower-layer wiring and includes a four-layer stacked structure. A contact plug contains aluminum. The contact plug is filled in a contact hole formed in the interlayer dielectric film in such a manner that the contact plug reaches the lower-layer wiring. Two upper layers and two lower layers in the stacked structure respectively have tapers on an inner surface of the contact hole. The taper of two upper layers and the taper of two lower layers have different angles from each other.

Embodiments will now be explained with reference to the accompanying drawings. The present embodiment is applied to a NAND-EEPROM (Electrically Erasable Programmable Read-Only Memory) as an example. The present embodiment is applicable not only to the NAND-EEPROM but also to an arbitrary semiconductor device including aluminum-containing contact plugs. Furthermore, in the present embodiment, a term indicating a vertical direction indicates a relative direction when a surface of a semiconductor substrate 10, on which memory cells MC are provided, is assumed as "upper surface" but often differs from a vertical direction based on a gravitational acceleration direction.

First Embodiment

Figure 1:
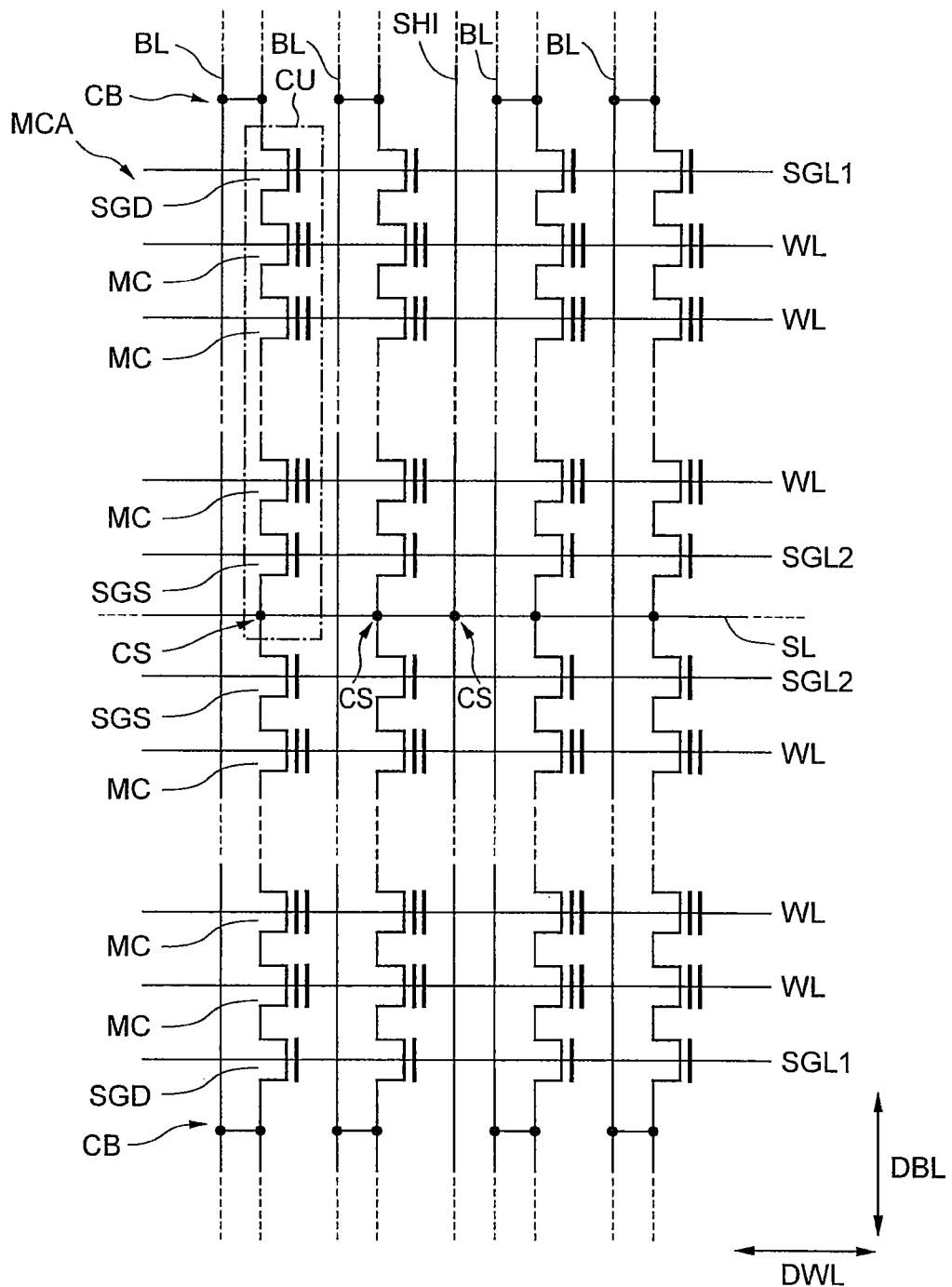
FIG. 1 is a circuit diagram showing an example of a part of a memory cell array MCA in a NAND-EEPROM according to a first embodiment.

FIG. 1 is a circuit diagram showing an example of a part of a memory cell array MCA in a NAND-EEPROM according to a first embodiment. The memory cell array MCA includes a plurality of memory cells MC and selection gate transistors SGD and SGS.

The memory cells MC are connected in series between the two selection gate transistors SGD and SGS and constitute one NAND cell unit CU (hereinafter, simply "cell unit CU"). The cell unit CU is electrically connected to a bit line BL via the selection gate transistor SGD. The cell unit CU is also electrically connected to a source line SL via the selection gate transistor SGS.

One end of the selection gate transistor SGD is electrically connected to the bit line BL via a bit contact CB. One end of the selection gate transistor SGS is electrically connected to the source line SL via a source contact CS. The selection gate transistors SGD and SGS operate in response to signals from signal lines SGL1 and SGL2, respectively. The selection gate transistors SGD and SGS can thereby selectively connect the memory cells MC in the cell unit CU to between the bit line BL and the source line SL.

A plurality of cell units CU adjacent in an extension direction DBL of bit lines BL share one bit line BL. A plurality of cell units CU adjacent in an extension direction DWL of word lines WL share word lines WL.

One bit contact CB is shared between the two cell units CU adjacent to the bit contact CB in the direction DBL. Similarly, one source contact CS is shared between the two cell units CU adjacent to the source contact CS in the direction DBL.

Figure 2:
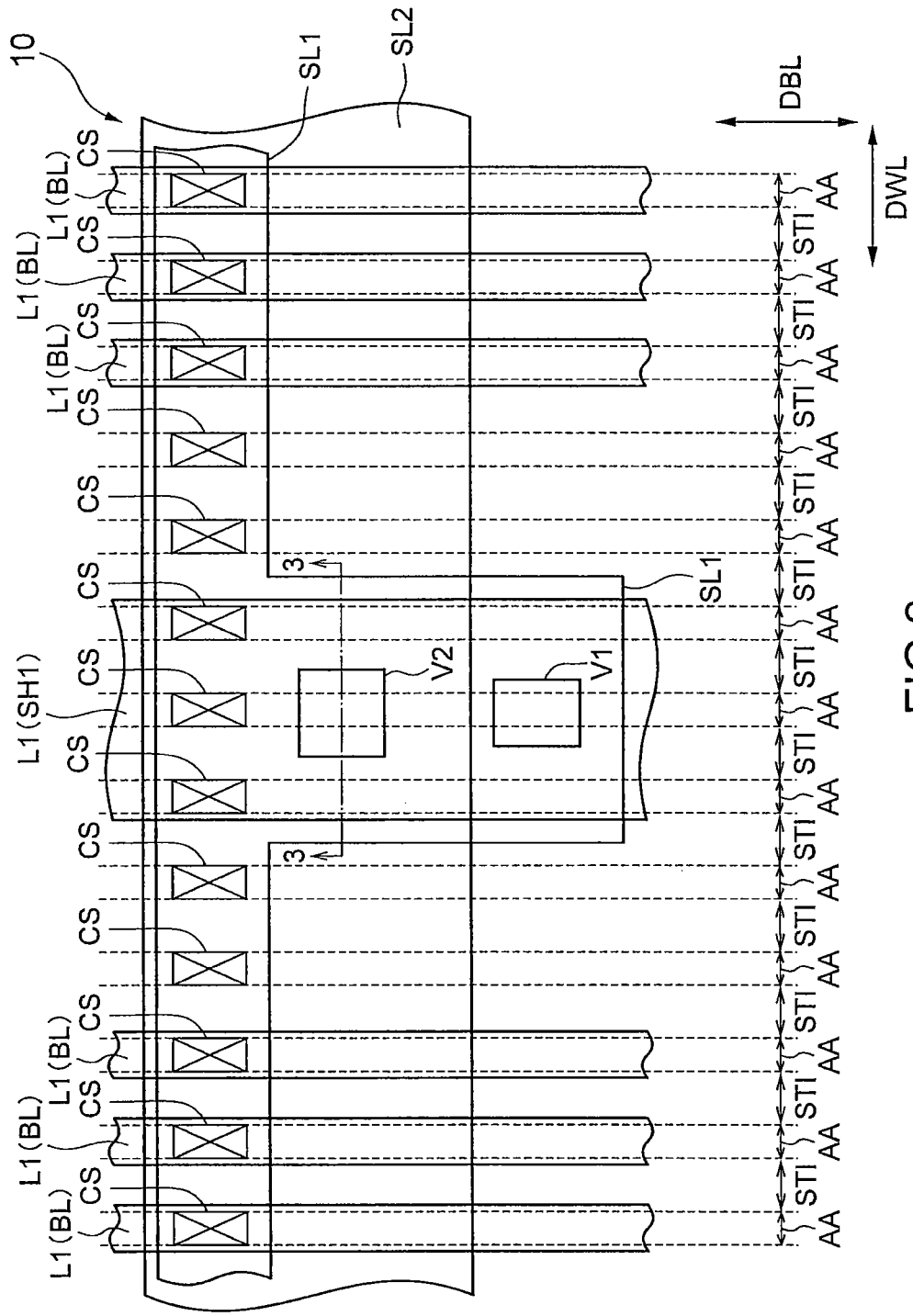
FIG. 2 is a plan view showing an example of a layout pattern of a part of the memory cell array MCA.

FIG. 2 is a plan view showing an example of a layout pattern of a part of the memory cell array MCA. A plurality of element isolation regions STI (Shallow Trench Isolation) are formed into stripes along the direction DBL on the semiconductor substrate 10. An active area AA is provided between the two adjacent element isolation regions STI. Therefore, a plurality of active areas AA are formed into stripes along the direction DBL similarly to the element isolation regions STI. The adjacent active areas AA are electrically isolated from each other by the element isolation region STI present between those active areas AA.

Source layers of a plurality of selection gate transistors SGS are formed in the semiconductor substrate 10 and commonly connected to a first source line SL1 via the source contacts CS, respectively. The first source line SL1 is connected to a source shunt line SH1 through a via contact V1. The source shunt line SH1 is a wiring in an upper layer than a metal layer of the first source line SL1. Furthermore, the source shunt line SH1 is connected to a second source line SL2 through a via contact V2. The second source line SL2 as well as the first source line SL1 extends in the direction DWL, and the second source line SL2 is a wiring in an upper layer than a layer of the source shunt line SH1. In this way, the first source line SL1, the source shunt line SH1, and the second source line SL2 are formed in this order from below. The source shunt line SH1 is formed in a wiring layer L1 that is the same as that in which the bit lines BL are provided.

The via contact V2 is used to connect a copper wiring as a lower layer to an aluminum wiring as an upper layer. The via contact V2 is used not only for connecting the source shunt line SH1 to the second source line SL2 but also for connecting the other wirings, for example, connecting one bit line BL to a sense amplifier (not shown) or connecting one word line WL to a word line driver (not shown).

Figure 3:
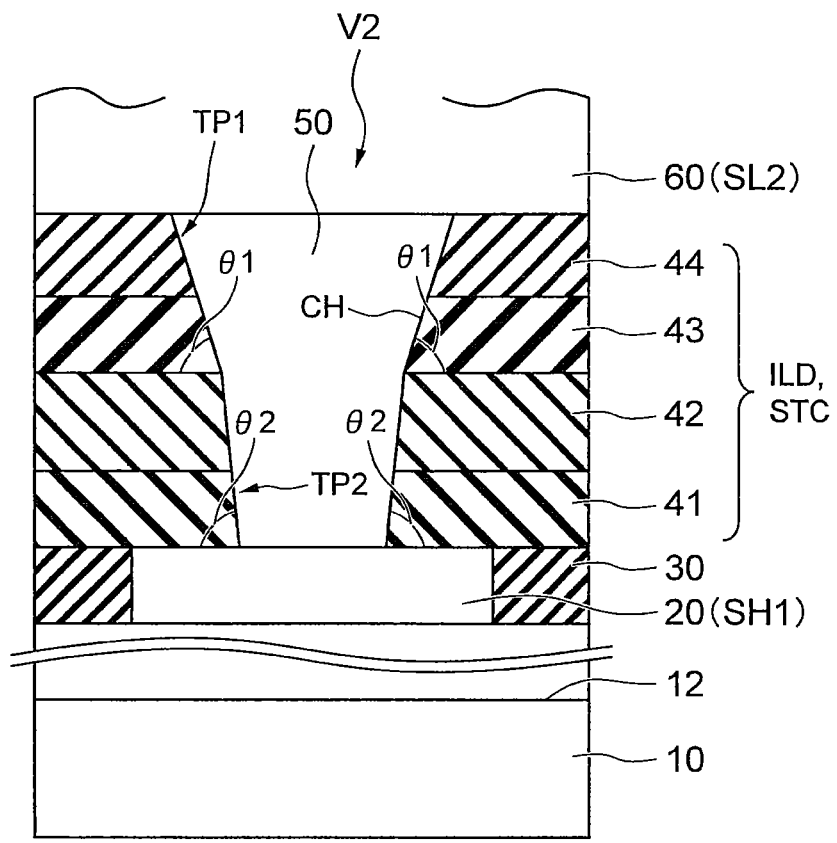
FIG. 3 is a cross-sectional view showing an example of a configuration of the via contact V2 and an interlayer dielectric film ILD according to the first embodiment.

FIG. 3 is a cross-sectional view showing an example of a configuration of the via contact V2 and an interlayer dielectric film ILD according to the first embodiment. FIG. 3 corresponds to a cross-section taken along, for example, a line 3-3 of FIG. 2. The via contact V2 is a contact that electrically connects a lower-layer wiring 20 to an upper-layer wiring 60 and provided as a part of a multilayer wiring structure. The lower-layer wiring 20 corresponds to, for example, the source shunt line SH1 shown in FIG. 2, and the upper-layer wiring 60 corresponds to, for example, the second source line SL2 shown in FIG. 2.

The multilayer wiring structure connected to semiconductor elements are formed on the semiconductor elements on the semiconductor substrate 10. The lower-layer wiring 20 (the source shunt line SH1, for example) constituting the multilayer wiring structure is provided above a surface 12 of the semiconductor substrate 10. The lower-layer wiring 20 is formed so as to be embedded in an insulating film 30 by a damascene method. The lower-layer wiring 20 is formed by using, for example, a metallic material mainly containing copper.

The interlayer dielectric film ILD is provided on the lower-layer wiring 20 and the insulating film 30. The interlayer dielectric film ILD includes a four-layer stacked structure STC. The stacked structure STC is constituted by a first layer 41 closest to the lower-layer wiring 20, a second layer 42 on the first layer 41, a third layer 43 on the second layer 42, and a fourth layer 44 on the third layer 43. The first layer 41 is formed by using, for example, an SiCN porous layer (specifically, "BLOk" (trademark of AMAT (Applied Materials, Inc.)). The first layer 41 is the lowest in dielectric constant among the first to fourth layers 41 to 44. Each of the second layer 42 and the fourth layer 44 is formed by using, for example, a silicon oxide film (dTEOS (thermally Densified TetraEthOxySilane), BSG (Boron Silicon Glass), or HTO (High Temperature Oxide)). The third layer 43 is formed by using, for example, a silicon nitride film or a silicon oxide film. Therefore, the third layer 43 is higher than the second layer 42 and the fourth layer 44 in dielectric constant. That is, when dielectric constants of the first layer 41 to the fourth layer 44 are assumed as E41 to E44, respectively, the dielectric constants E41 to E44 satisfy a relation expressed by the following inequality expression.

$$E44<E43, E42<E43, \text{ and } E42>E41 \quad \text{(Expression 1)}$$

In the first embodiment, the second layer 42 and the fourth layer 44 are formed by the same material (a silicon oxide film formed by using the dTEOS). Alternatively, the second layer 42 and the fourth layer 44 can be formed by different materials as long as the third layer 43 can be selectively etched (the materials of the second and fourth layers 42 and 44 are higher than the third layer 43 in etching rate). Conversely, an arbitrary material can be used as a material of the third layer 43 as long as the material can function as an etching stopper at the time of etching the fourth layer 44. However, in the first embodiment, the third layer 43 is formed thin (about 10 nm in thickness, for example) so that the third layer 43 and the second layer 42 can be etched continuously to the fourth layer 44 without completely stopping etching the fourth layer 44.

A contact hole CH reaching the lower-layer wiring 20 is formed in the interlayer dielectric film ILD. On an inner surface of the contact hole CH, each of the fourth layer 44 and the third layer 43 serving as the two upper layers in the stacked structure STC has a first taper TP1. The first taper TP1 is inclined at a first angle $\theta1$ with respect to the surface 12 of the semiconductor substrate 10. On the inner surface of the contact hole CH, each of the second layer 42 and the first layer 41 serving as the two lower layers in the stacked structure STC has a second taper TP2. The second taper TP2 is inclined at a second angle $\theta2$, which is greater than the first angle $\theta1$, with respect to the surface 12 of the semiconductor substrate 11. The first angle $\theta1$ differs from the second angle $\theta2$. Specific numerical values of the first and second angles $\theta1$ and $\theta2$ are described later.

A contact plug 50 is filled in the contact hole CH. The contact plug 50 is formed by using, for example, a metallic material mainly containing aluminum. The contact plug 50 is connected to the lower-layer wiring 20 and filled in the contact hole CH with high embeddability. No void is generated in the contact plug 50.

Furthermore, the upper-layer wiring 60 (the second source line SL2, for example) is formed on the contact plug 50 and the interlayer dielectric film ILD. The upper-layer wiring 60 is formed by using, for example, a metallic material such as copper or aluminum. The upper-layer wiring 60 is electrically connected to the lower-layer wiring 20 via the contact plug 50.

FIGS. 4A to 4E are cross-sectional views showing an example of a manufacturing method of the NAND-EEPROM according to the first embodiment. After forming semiconductor elements of the memory cell array MCA and those of peripheral circuits on the semiconductor substrate 10, the multilayer wiring structure is formed on the semiconductor elements. A method of manufacturing the multilayer wiring structure is described in more detail with reference to FIGS. 4A to 4E.

First, the lower-layer wiring 20 (the source shunt line SH1, for example) is embedded in the insulating film 30 by the use of the damascene method. The insulating film 30 is formed by using, for example, a silicon oxide film. The lower-layer wiring 20 is formed by using, for example, the metallic material mainly containing copper.

The four-layer stacked structure STC is then formed on the insulating film 30 and the lower-layer wiring 20. More specifically, the first layer 41, the second layer 42, the third layer 43, and the fourth layer 44 are deposited on the insulating film 30 and the lower-layer wiring 20 in this order by the use of a CVD (Chemical Vapor Deposition) method or the like. As described above, the first layer 41 is, for example, a porous film having a low-dielectric-constant, the second layer 42 and the fourth layer 44 are, for example, silicon oxide films each formed by using the dTEOS, and the third layer 43 is, for example, a silicon nitride film.

Figure 4A:
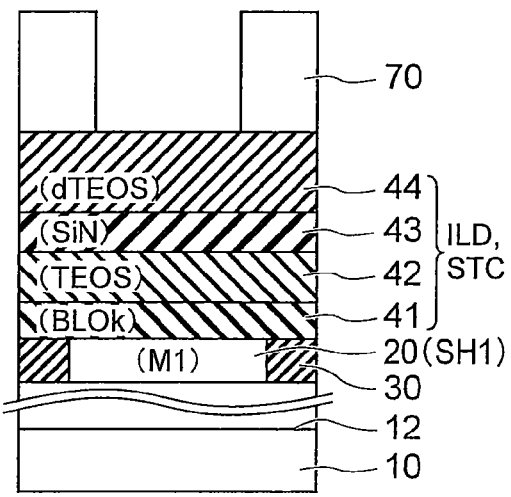
FIGS. 4A to 4E are cross-sectional views showing an example of a manufacturing method of the NAND-EEPROM according to the first embodiment.

Next, a photoresist 70 is formed on the fourth layer 44 by the use of a lithographic technique. The photoresist 70 is patterned into a layout of the via contact V2. The structure shown in FIG. 4A is thereby obtained.

Figure 4B:
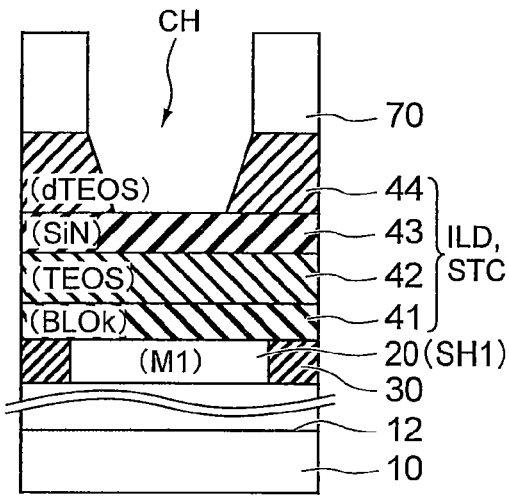

Next, as shown in FIG. 4B, by using the photoresist 70 as a mask, the fourth layer 44 is etched by the use of either a RIE (Reactive Ion Etching) method or a CDE (Chemical Dry Etching) method. In this etching process, the fourth layer 44 is etched while reducing an etching bias (that is, reducing anisotropy). The fourth layer 44 is thereby processed to have the first taper TP1 on a side surface thereof.

Figure 4C:
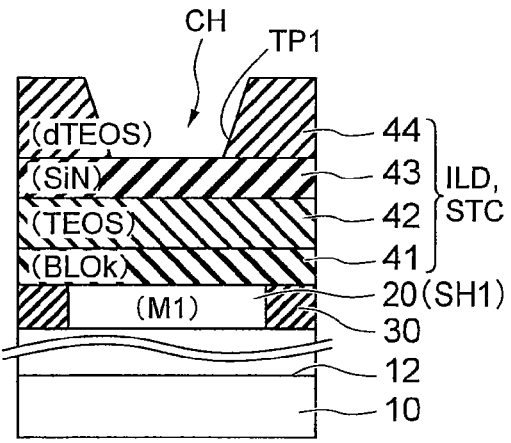

In the process of etching the fourth layer 44, when the third layer 43 is exposed, the photoresist 70 is removed. The removal of the photoresist 70 is executed by performing ashing on the photoresist 70 by using oxygen. In the process of etching the fourth layer 44, the third layer 43 may be used as the etching stopper. That is, when the third layer 43 is exposed (when the third layer 43 is detected), the etching of the fourth layer 44 is temporarily stopped and the photoresist 70 is removed. The structure shown in FIG. 4C is thereby obtained. At this time, the first layer 41 to the third layer 43 inhibit oxygen used when removing the photoresist 70 from reaching the lower-layer wiring 20. Therefore, the first layer 41 to the third layer 43 can suppress oxidization of the lower-layer wiring 20 and thereby suppress a contact failure.

Next, by using the fourth layer 44 as a mask, the third layer 43 is etched by either the RIE method or the CDE method. In a process of etching the third layer 43, similarly to the process of etching the fourth layer 44, the third layer 43 is etched while reducing an etching bias (that is, reducing anisotropy). Similarly to the fourth layer 44, therefore, the third layer 43 is processed to have the first taper TP1 on a side surface thereof.

Figure 4D:
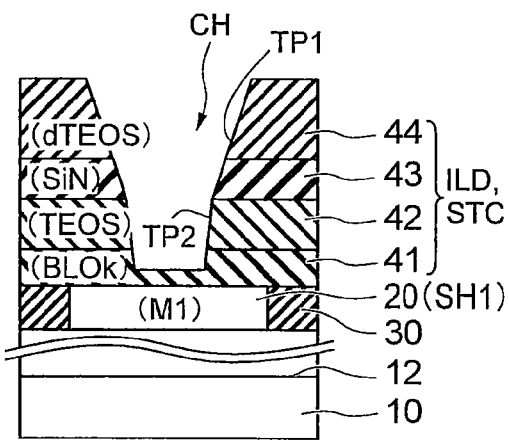

Next, by using the third layer 43 and the fourth layer 44 as a mask, the second layer 42 is etched by either the RIE method or the CDE method. In a process of etching the second layer 42, the second layer 42 is anisotropically etched while setting an etching bias higher than those at times of etching the third layer 43 and the fourth layer 44. The second layer 42 is thereby processed to have the second taper TP2 that is steeper than the first taper TP1 on a side surface thereof as shown in FIG. 4D. The timing of changing etching conditions for forming the first taper TP1 to those for forming the second taper TP2 can be set equal to a timing of detecting the material of the second layer 42 after detecting the material of the third layer 43. Therefore, no problem occurs even if the second layer 42 and the fourth layer 44 are made of the same material.

Figure 4E:
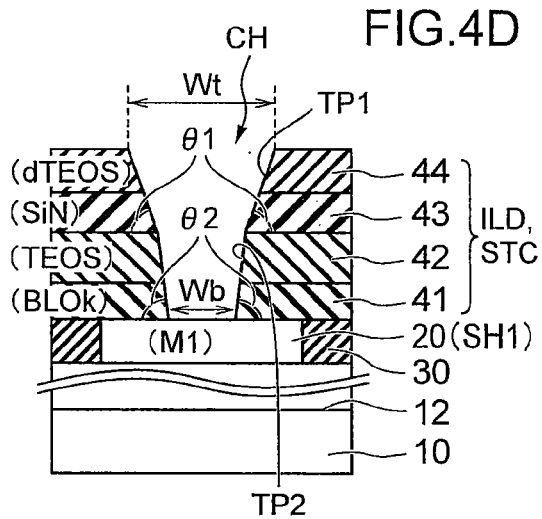

Furthermore, by using the third layer 43 and the fourth layer 44 as a mask, the first layer 41 is etched by either the RIE method or the CDE method. In a process of etching the first layer 41, similarly to the process of etching the second layer 42, the first layer 41 is anisotropically etched while setting an etching bias to be relatively high. The first layer 41 is thereby processed to have the second taper TP2 on a side surface thereof similarly to the second layer 42 as shown in FIG. 4E.

In this way, the contact hole CH having the taper TP1 on the two upper layers 44, 43 and the taper TP2 on the two lower layers 42, 41, respectively, is formed in the interlayer dielectric film ILD. The tapers TP1 and TP2 are different from each other in angle. An inner side surface of the contact hole CH has the first taper TP1 inclined at the first angle $\theta 1$ with respect to the surface 12 of the semiconductor substrate 10 on each of the fourth layer 44 and the third layer 43. And, the inner side surface of the contact hole CH has the second taper TP2 inclined at the second angle $\theta 2$ with respect to the surface 12 of the semiconductor substrate 10 on each of the second layer 42 and the first layer 41. By providing such first and second tapers TP1 and TP2 on the inner side surface of the contact hole CH, an opening diameter Wt is made larger than an opening diameter Wb. Note that Wt is the opening diameter of the contact hole CH on an upper surface of the interlayer dielectric film ILD and that Wb is the opening diameter of the contact hole CH on a bottom surface of the interlayer dielectric film ILD.

The second angle $\theta 2$ is closer to a perpendicular direction to the surface 12 of the semiconductor substrate 10 than the first angle $\theta 2$. And, the second taper TP2 is steeper than the first taper TP1. In this way, by changing angles of the tapers on the inner side surface of the contact hole CH in a stepwise manner, it is possible to keep large a contact area between the contact plug 50 and the lower-layer wiring 20 while improving the embeddability (coverage) of the material (Al) of the contact plug 50.

The magnitudes of the opening diameters Wt and Wb are considered next. If the opening diameter Wt is too large, then a distance between the two adjacent via contacts V2 becomes small, and therefore a breakdown voltage between the two adjacent via contacts V2 becomes low. If the opening diameter Wt is too large, it is necessary to make wide wirings formed on the via contacts V2, which is against the downscaling of memory elements. Conversely, if the opening diameter Wt is too small, the embeddability (coverage) of the material (Al) of the contact plug 50 is deteriorated. Therefore, it is necessary to control the opening diameter Wt to have the magnitude in a predetermined range.

On the other hand, if the opening diameter Wb is too large, the contact plug 50 possibly protrudes from the lower-layer wiring 20. Conversely, if the opening diameter Wb is too small, then the contact area between the contact plug 50 and the lower-layer wiring 20 becomes small, and a contact resistance possibly rises. Therefore, it is necessary to control the opening diameter Wb to have the magnitude in a predetermined range similarly to the opening diameter Wt.

According to the first embodiment, the first taper TP1 is made gentler than the second taper TP2, thereby it is easier for the material of the contact plug 50 to enter the contact hole CH. In addition, the second taper TP2 is made steeper than the first taper TP1, thereby it is possible to suppress the opening diameter Wb of the contact hole CH on the bottom surface of the interlayer dielectric film ILD from becoming too small. By keeping the magnitude of the opening diameter Wb large to some extent, it is possible to suppress the contact resistance from rising. In this way, the first embodiment can keep the magnitude of the opening diameter Wb large to some extent while making the first taper TP1 gentle and improving the embeddability of the material of the contact plug 50 without excessively increasing the opening diameter Wt. This can facilitate setting each of the opening diameters Wt and Wb to have the magnitude in the predetermined range. The "gentle" taper means that the angle of the taper with respect to the surface 12 of the semiconductor substrate 10 is relatively small and not near the perpendicular direction (90 degrees) of the surface 12 of the semiconductor substrate 10. The "steep" taper means that the angle of the taper with respect to the surface 12 of the semiconductor substrate 10 is relatively great and near the perpendicular direction (90 degrees) thereof.

As shown in FIG. 3, after forming the contact hole CH, the material of the contact plug 50 is filled in the contact hole CH. As described above, the material of the contact plug 50 is the metallic material mainly containing aluminum. Aluminum is inferior to such metal as tungsten in embeddability (i.e. coverage). However, the material of the contact plug 50 can be embedded in the contact hole CH without any void because the first taper TP1 is relatively gentle. The upper-layer wiring 60 is formed on the contact plug 50 and the interlayer dielectric film ILD. Thereafter, an interlayer dielectric film and/or a wiring layer (not shown) on an upper layer is formed, thereby completing the semiconductor device according to the first embodiment.

In this way, the first embodiment can improve the embeddability of the material of the contact plug 50 while suppressing the contact resistance from rising by changing the angles of the tapers on the inner side surface of the contact hole CH in a stepwise manner. Normally, when the angle $\theta 1$ of the taper on the inner side surface of the contact hole CH is made gentle (decreased), the opening diameter Wb of the contact hole CH on the bottom surface of the interlayer dielectric film ILD becomes smaller. However, in the first embodiment, the angles of the tapers on the inner side surface of the contact hole CH are changed in a stepwise manner. Accordingly, it is possible to make gentle the angle $\theta 1$ of the taper in an upper portion of the contact hole CH while keeping the magnitude of the opening diameter Wb of the contact hole CH on the bottom surface of the interlayer dielectric film ILD. It is thereby possible to improve the embeddability of the material of the contact plug 50, and to reduce a void incidence rate in the contact plug 50 as described later. As a result, it is possible to improve the reliability of the semiconductor device according to the first embodiment.

Furthermore, the magnitude of the opening diameter Wb of the contact hole CH on the bottom surface of the interlayer dielectric film ILD is maintained and the embeddability of the material of the contact plug 50 is improved. Therefore, it is possible to further increase an aspect ratio of the contact hole CH. That is, according to the first embodiment, it is possible to further increase the thickness of the interlayer dielectric film ILD and to reduce the inter-wiring capacity.

In the first embodiment, to change the angles of the tapers on the inner side surface of the contact hole CH in a stepwise manner, the third layer 43 is inserted between the second layer 42 and the fourth layer 44. That is, the third layer 43 is used to change the etching conditions. Therefore, a boundary position (height) between the first taper TP1 and the second taper TP2 is changed based on an insertion position (height) of the third layer 43. Therefore, it is possible to adjust the third layer 43 to be located at a lower position so as to further improve the embeddability of the contact plug 50. Conversely, it is possible to adjust the third layer 43 to be located at a higher position so as to increase the opening diameter Wb of the contact hole CH on the bottom surface of the interlayer dielectric film ILD. In this way, the insertion position (height) of the third layer 43 can be changed in a range from a bottom surface of the second layer 42 to an upper surface of the fourth layer 44.

If the third layer 43 is not inserted, it is difficult to change the angles of the tapers on the inner side surface of the contact hole CH in a stepwise manner. As a result, the opening diameter Wb becomes smaller and a contact failure tends to occur, or the opening diameter Wt becomes larger and it is impossible to maintain the breakdown voltage between the two adjacent via contacts V2.

Furthermore, in the first embodiment, in the process of forming the contact hole CH, the photoresist 70 is removed when an upper surface of the third layer 43 is exposed. If the third layer 43 is not provided, the photoresist 70 is removed when the first layer 41 is exposed after etching the fourth layer 44 and the second layer 42. However, the first layer 41 is higher than the second layer 42 to the fourth layer 44 in etching rate as described above and it is difficult to control etching of the first layer 41. As a result, in the process of forming the contact hole CH, the lower-layer wiring 20 is possibly already exposed at the time of detecting the first layer 41. In this case, oxygen used in the ashing to remove the photoresist 70 also reaches the lower-layer wiring 20. When the lower-layer wiring 20 is formed by using copper, a surface of the lower-layer wiring 20 is possibly oxidized with oxygen used in the ashing process. When copper oxide is formed on the surface of the lower-layer wiring 20, the contact resistance between the contact plug 50 and the lower-layer wiring 20 rises and a contact failure tends to occur. As can be understood, it is difficult to control the first layer 41 (a porous film, for example) during etching and difficult to use the first layer 41 as an etching stopper. On the other hand, in the first embodiment, the photoresist 70 is removed when the upper surface of the third layer 43 suited as the etching stopper is exposed. Therefore, it is possible to suppress oxidization of the lower-layer wiring 20 and thereby possible to suppress the contact failure between the contact plug 50 and the lower-layer wiring 20.

In the first embodiment, the first layer 41 is formed by using a porous film having a low-dielectric-constant. Therefore, the inter-wiring capacity decreases. Furthermore, the first layer 41 is easy to etch anisotropically because of the high etching rate. That is, it can be said that the first layer 41 is easy to process to have the steep second taper TP2. Therefore, it is possible to keep large the opening diameter Wb of the contact hole CH on the bottom surface of the interlayer dielectric film ILD.

In this way, the NAND-EEPROM according to the first embodiment can realize the reduction in the inter-wiring capacity and the suppression of the inter-wiring contact failure.

Figures 5A, 5B:
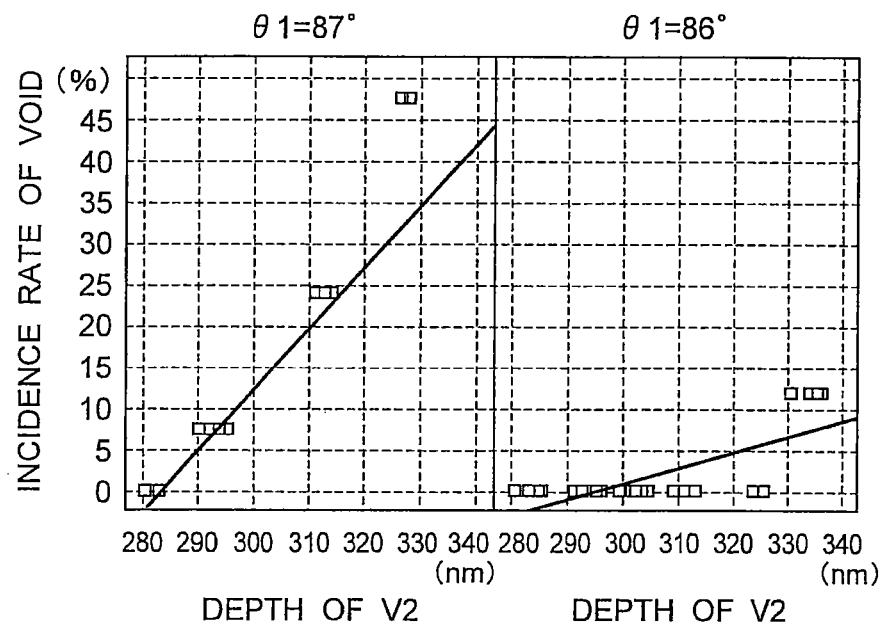
FIGS. 5A and 5B are graphs showing examples of relations between a depth of the via contact V2 and the void incidence rate in the contact plug 50.
Figure 6:
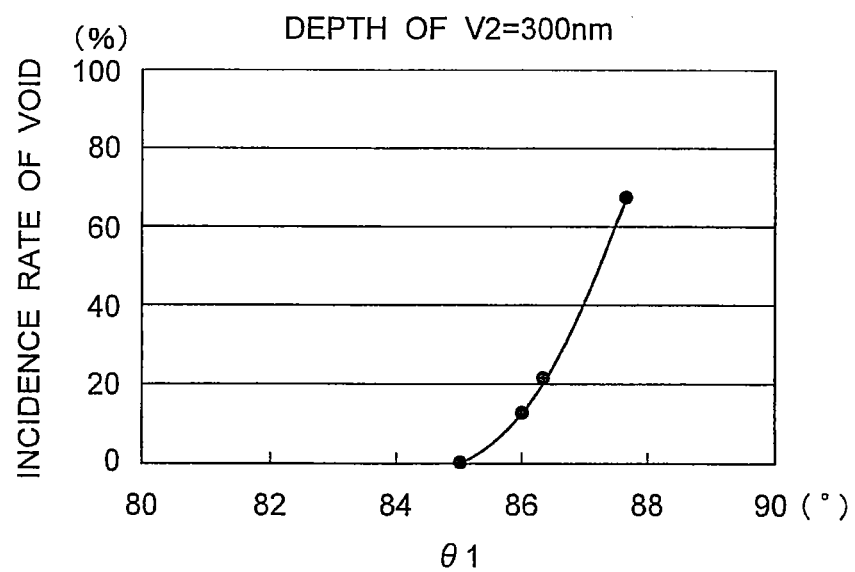
FIG. 6 is a graph showing an example of a relation between the first angle θ1 and the void incidence rate.

Furthermore, the first and second angles $\theta 1$ and $\theta 2$ are considered with reference to FIGS. 5A to 6.

FIGS. 5A and 5B are graphs showing relations between a depth of the via contact V2 and the void incidence rate in the contact plug 50. FIG. 5A shows the void incidence rate when the first angle $\theta 1$ is 87 degrees. FIG. 5B shows the void incidence rate when the first angle $\theta 1$ is 86 degrees. A horizontal axis of each of the graphs of FIGS. 5A and 5B indicates the depth of the via contact V2 (the contact hole CH), and a vertical axis thereof indicates the void incidence rate.

As shown in FIG. 5A, when the first angle $\theta 1$ is 87 degrees, the void incidence rate becomes higher as the via contact V2 is deeper. This means the embeddability (coverage) of the material of the contact plug 50 is deteriorated in proportion to the depth of the via contact V2 because the first taper TP1 is steep. That is, when the first angle $\theta 1$ is equal to or greater than 87 degrees, the embeddability (coverage) of the material of the contact plug 50 is deteriorated.

On the other hand, as shown in FIG. 5B, if the first angle $\theta 1$ is 86 degrees, the void incidence rate is kept low even if the via contact V2 is deeper. This means that the embeddability (coverage) of the material of the contact plug 50 is improved as a result of making the first taper TP1 gentle. That is, if the first angle $\theta 1$ is equal to or smaller than 86 degrees, the embeddability (coverage) of the material of the contact plug 50 is good. Therefore, FIGS. 5A and 5B indicate that the void incidence rate in the contact plug 50 is improved by decreasing the angle of the first taper TP1 only by 1 degree.

FIG. 6 is a graph showing a relation between the first angle $\theta 1$ and the void incidence rate. The depth of the via contact V2 is set to about 300 nm. In the graph of FIG. 6, a horizontal axis indicates the first angle $\theta 1$, and a vertical axis indicates the void incidence rate. In the graph of FIG. 6, the void incidence rate starts rising when the first angle $\theta 1$ exceeds 85 degrees.

When the first angle θ1 becomes equal to or greater than 87 degrees, the void incidence rate becomes considerably high. This indicates that voids start to be generated in the contact plug 50 when the first angle θ1 exceeds 85 degrees. On the other hand, when the first angle θ1 is equal to or smaller than 86 degrees, voids are hardly generated in the contact plug 50. This is because the embeddability (coverage) of the material of the contact plug 50 is further improved as a result of making the first taper TP1 gentle. That is, when the first angle θ1 is equal to or smaller than 85 degrees, the embeddability is further improved. It is needless to mention that the embeddability of the material of the contact plug 50 also depends on the depth of the via contact V2. Nevertheless, it is effective to set the first angle θ1 to be preferably equal to or smaller than 86 degrees, more preferably equal to or smaller than 85 degrees as long as the depth of the via contacts V2 used in the NAND-EEPROM is within an ordinary depth range (200 nm to 400 nm, for example).

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a semiconductor substrate;
a lower-layer wiring provided above a surface of the semiconductor substrate;
an interlayer dielectric film provided on the lower-layer wiring and including a four-layer stacked structure; and
a contact plug containing aluminum, the contact plug being filled in a contact hole formed in the interlayer dielectric film in such a manner that the contact plug reaches the lower-layer wiring, wherein
two upper layers and two lower layers in the stacked structure respectively have tapers on an inner surface of the contact hole, the taper of two upper layers and the taper of two lower layers have different angles from each other.

2. The device of claim 1, wherein the lower-layer wiring is a wiring containing copper.

3. The device of claim 1, wherein the two upper layers respectively have a first taper on the inner surface of the contact hole, the first taper inclines at a first angle with respect to the surface of the semiconductor substrate,
the two lower layers respectively have a second taper on the inner surface of the contact hole, the second taper inclines at a second angle with respect to the surface of the semiconductor substrate, and
the second angle is greater than the first angle.

4. The device of claim 2, wherein the two upper layers respectively have a first taper on the inner surface of the contact hole, the first taper inclines at a first angle with respect to the surface of the semiconductor substrate,
the two lower layers respectively have a second taper on the inner surface of the contact hole, the second taper inclines at a second angle with respect to the surface of the semiconductor substrate, and
the second angle is greater than the first angle.

5. The device of claim 3, wherein the first angle is equal to or smaller than 86 degrees.

6. The device of claim 3, wherein the first angle is equal to or smaller than 85 degrees.

7. The device of claim 1, wherein in the stacked structure, a first layer closest to the lower-layer wiring is a porous film, a second layer on the first layer is an oxide film, a third layer on the second layer is a nitride film, and a fourth layer on the third layer is an oxide film.

8. The device of claim 7, wherein when a dielectric constant of the first layer is E41, a dielectric constant of the second layer is E42, a dielectric constant of the third layer is E43, and a dielectric constant of the fourth layer is E44, the dielectric constants E41, E42, E43, and E44 satisfy an expression 1

$$E44 < E43, E42 < E43, \text{ and } E42 > E41 \qquad \text{(Expression 1)}.$$

* * * * *